US009735026B2

(12) United States Patent
Brown et al.

(10) Patent No.: US 9,735,026 B2
(45) Date of Patent: Aug. 15, 2017

(54) CONTROLLING CLEANING OF A LAYER ON A SUBSTRATE USING NOZZLES

(71) Applicant: Tokyo Electron Limited, Minato-ku, Tokyo (JP)

(72) Inventors: Ian J. Brown, Austin, TX (US); Wallace P. Printz, Austin, TX (US); Benjamen M. Rathsack, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 666 days.

(21) Appl. No.: 14/091,923

(22) Filed: Nov. 27, 2013

(65) Prior Publication Data
US 2014/0144463 A1    May 29, 2014

Related U.S. Application Data

(60) Provisional application No. 61/730,479, filed on Nov. 27, 2012.

(51) Int. Cl.
*B08B 6/00* (2006.01)
*B08B 7/04* (2006.01)
(Continued)

(52) U.S. Cl.
CPC .......... *H01L 21/31138* (2013.01); *G03F 7/42* (2013.01); *G03F 7/423* (2013.01);
(Continued)

(58) Field of Classification Search
None
See application file for complete search history.

(56) References Cited

U.S. PATENT DOCUMENTS 5,669,979 A * 9/1997 Elliott .................. B08B 7/0042
                                                        134/1
6,503,693 B1 * 1/2003 Mohondro .............. G03F 7/405
                                                        216/49
(Continued)

FOREIGN PATENT DOCUMENTS

TW       201133584 A    8/2011

OTHER PUBLICATIONS

Taiwanese Patent Application No. 102143291, "Notification of Examination Opinions," issued Jun. 29, 2015, Taiwanese Patent Application filing date Nov. 27, 2013.

*Primary Examiner* — Eric Golightly
*Assistant Examiner* — Arlyn I Rivera-Cordero
(74) *Attorney, Agent, or Firm* — Wood Herron & Evans LLP

(57) ABSTRACT

Provided is a method for cleaning an ion implanted resist layer or a substrate after an ashing process. A duty cycle for turning on and turning off flows of a treatment liquid using two or more nozzles is generated. The substrate is exposed to the treatment liquid comprising a first treatment chemical, the first treatment chemical with a first film thickness, temperature, total flow rate, and first composition. A portion of a surface of the substrate is concurrently irradiated with UV light while controlling the selected plurality of cleaning operating variables in order to achieve the two or more cleaning objectives. The cleaning operating variables comprise two or more of the first temperature, first composition, first film thickness, UV wavelength, UV power, first process time, first rotation speed, duty cycle, and percentage of residue removal are optimized to achieve the two or more cleaning objectives.

20 Claims, 13 Drawing Sheets

(51) Int. Cl.
  *B08B 5/00* (2006.01)
  *B08B 7/00* (2006.01)
  *H01L 21/311* (2006.01)
  *H01L 21/67* (2006.01)
  *G03F 7/42* (2006.01)

(52) U.S. Cl.
  CPC ........ *G03F 7/425* (2013.01); *H01L 21/67051* (2013.01); *H01L 21/67115* (2013.01)

(56) References Cited

U.S. PATENT DOCUMENTS

| | | | |
|---|---|---|---|
| 6,524,936 B2 | 2/2003 | Hallock et al. | |
| 8,632,692 B2* | 1/2014 | Yates | B08B 3/08 216/108 |
| 2002/0151156 A1 | 10/2002 | Hallock et al. | |
| 2002/0157686 A1* | 10/2002 | Kenny | B08B 3/00 134/1.3 |
| 2005/0158671 A1 | 7/2005 | Shimizu et al. | |
| 2008/0160729 A1 | 7/2008 | Krueger et al. | |
| 2009/0151755 A1* | 6/2009 | Beck | C07C 211/63 134/42 |
| 2010/0018951 A1 | 1/2010 | Christenson et al. | |
| 2010/0029088 A1* | 2/2010 | Mayer | C23F 1/08 438/748 |
| 2010/0149476 A1* | 6/2010 | Kim | G02F 1/136286 349/138 |
| 2010/0239986 A1* | 9/2010 | Kaneyama | G03F 7/70991 430/434 |
| 2011/0226280 A1 | 9/2011 | Berry et al. | |
| 2011/0253176 A1* | 10/2011 | Saito | H01L 21/67051 134/26 |
| 2011/0259376 A1* | 10/2011 | Wagener | H01L 21/6708 134/94.1 |
| 2012/0052687 A1 | 3/2012 | Raghavan et al. | |
| 2012/0158169 A1* | 6/2012 | Finn | H01L 21/67253 700/109 |
| 2012/0247505 A1 | 10/2012 | Brown et al. | |

* cited by examiner

CONTROLLING CLEANING OF A LAYER ON A SUBSTRATE USING NOZZLES

Pursuant to 37 C.F.R. §1.78(a)(4), this application claims the benefit of and priority to prior filed Provisional Application Ser. No. 61/730,479 entitled "CONTROLLING CLEANING OF A LAYER ON A SUBSTRATE USING NOZZLES", filed on Nov. 27, 2012, which is expressly incorporated herein by reference.

FIELD

The present application generally relates to semiconductor processing and specifically to a cleaning process on a substrate using a first step of immersion in a first treatment chemical and concurrently irradiating the substrate with ultra-violet (UV) light and a second step using a wet clean process using a second treatment chemical.

RELATED ART

In semiconductor processing control of generation and lifetime of active chemical species is important to optimize cleaning processes with respect to removal efficiency of desired material, process time, and selectivity to other materials present on the substrate. In aqueous and plasma chemistry, generation of radicals is a convenient way to generate highly reactive and targeted species to remove material, Radicals are generated by mixing of two or more chemicals, (e.g. sulfuric add and hydrogen peroxide to form hydroxyl radicals) or by application of energy, for example, light, heat, electrical/magnetic force, electrochemical, or mechanical energy. Ion implanted photoresist is challenging to remove because a hard crust layer forms during the implant process on the photoresist. When a certain range of doses and energies are used to implant ions on the resist, these hard crust layers have to be removed using a plasma ashing step. There are two methods known to remove ion implanted resist at levels of $1e^{15}$ atoms/cm$^2$ and higher. The first method is a two-step process using oxidizing/reducing plasma ash and a 120-140° C. sulfuric and peroxide mixture (SPM) wet process to remove residual organics. The challenge with this process is oxidization of the silicon substrate leading to loss of dopant in subsequent wet cleans. The second method is an all wet removal approach using SPM chemistry.

The challenge with all wet process removal or wet benches is that the SPM has to be heated to temperatures approaching 250° C. to achieve the desired resist removal performance and at a removal rate that is practical for manufacturing. Wet benches typically operate with SPM temperatures up to 140° C. To reach SPM temperatures of 250° C., one-pass single substrate process tools are required. However, over time, the SPM loses its activity as the sulfuric add is diluted by the continuous replenishment of hydrogen peroxide that is required to retain its cleaning activity. With SPM, the best cleaning performance is achieved above 100 wt % total acid in the SPM. SPM below 80 wt % total add has very poor cleaning performance and a fresh batch of 108-96 wt % sulfuric add is often used. Methods exist to remove the excess water from the recycled SPM or using electrolyzed sulfuric add to extend the usage life of the sulfuric add. Both methods significantly increase the complexity, capital cost, and operating costs of the resist strip process. Similar considerations are also applicable to cleaning of substrates after an ashing process.

Later approaches include cleaning techniques using a two-step process with hydrogen peroxide and ultra violet (UV) light followed by a wet stripping process. One such technique is U.S. Patent Publication No. 2012/0052687, by Ra haven, et al., (Raghaven), "Use of Catalyzed Hydrogen Peroxide (CHP) Chemical System for Stripping of Implanted State-of-the-Art UV Resists" filed on Dec. 29, 2010, where a catalyzed hydrogen peroxide solution is used with UV light to disrupt the crust of implanted photoresist and subsequently removing the underlying photoresist with a sulfuric add peroxide mixture (SPM) in a wet etch process. Effectiveness of this technique is limited by the specific ranges of concentration of the catalyzed hydrogen peroxide, temperature of the treatment liquids, and speed of rotation of the substrate.

Another technique is contained in U.S. application Ser. No. 13/670,381, by Brown, I J, "METHOD OF STRIPPING PHOTORESIST ON A SINGLE SUBSTRATE SYSTEM", filed on Nov. 6, 2012 (Brown). Brown introduced operating variables consisting of UV wavelength, UV power, first rotation speed, first flow rate, second process time, second rotation speed, percentage of residue removal, and dispense temperature. The additional operating variables provide some flexibility to control the cleaning process, but some issues develop as the process is used in a manufacturing environment. Some of the issues include: a) rotation of bigger size substrates require new and stronger motors and associated housing, b) time constraints involved in starting up and stopping rotation of substrate increases with increasing size and speed, c) time needed to perform the softening of the residue is a function of at least two or more operating variables such as thickness of the first chemical film, rotation speed of the substrate, and exposure time to the UV light, concentration of the first chemical, and intensity of the UV light. The position of the nozzle relative to the substrate and flow rate of the first chemical also affects the cleaning of the substrate. In order to make single substrate cleaning of substrates economically feasible, these issues and operating challenges must be addressed when the cleaning process is implemented in production volume environment.

There is a need for a cleaning method and system that makes single substrate process to competitive in terms of cost of ownership and higher reliability in addition to expanding the process window for the stripping an ion implanted resist or cleaning or performing a post-ash cleaning. The key operating variables need to identified and ranges of the key operating variables need to be determined in order to develop a process sequence that addresses the issues and operating challenges and achieve the two or more cleaning objectives for a production single substrate cleaning method and system.

SUMMARY

Provided is a method for cleaning an ion implanted resist layer or a substrate after an ashing process. A duty cycle for turning on and turning off flows of a treatment liquid in two or more nozzles is generated. The substrate is exposed to the treatment liquid comprising a first treatment chemical, the first treatment chemical with a first film thickness, temperature, total flow rate, and first composition. A portion of a surface of the substrate is concurrently irradiated with UV light while controlling the selected plurality of cleaning operating variables in order to achieve the two or more cleaning objectives. The cleaning operating variables comprise two or more of the first temperature, first composition, first film thickness, UV wavelength, UV power, first process time, first rotation speed, duty cycle, and percentage of residue removal. The two or more cleaning operating variables are optimized to achieve the two or more cleaning objectives which can comprise (1) highest cleaning completion rate and (2) minimum film thickness of the treatment liquid.

LIST OF FIGURES

FIG. 4A depicts an exemplary top-view of an area of a substrate prior to cleaning while

FIG. 5A depicts another exemplary top-view of an area of a substrate before cleaning while

FIG. 6A depicts another exemplary top-view of an area of a substrate before cleaning while

DETAILED DESCRIPTION OF EXEMPLARY EMBODIMENTS

Figure 1A:
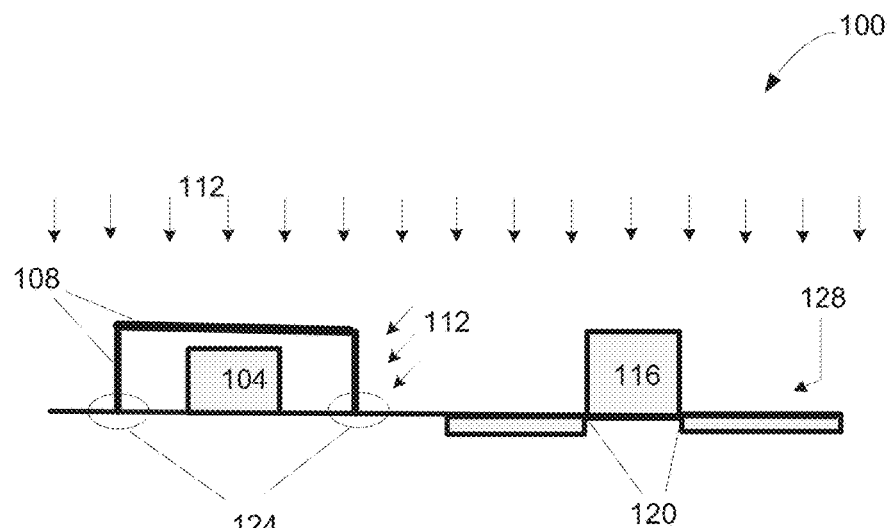
FIG. 1A depicts an exemplary prior art architectural diagram of the profile of a structure with crust fused to the substrate surface and near the edge bead region.
Figure 1B:
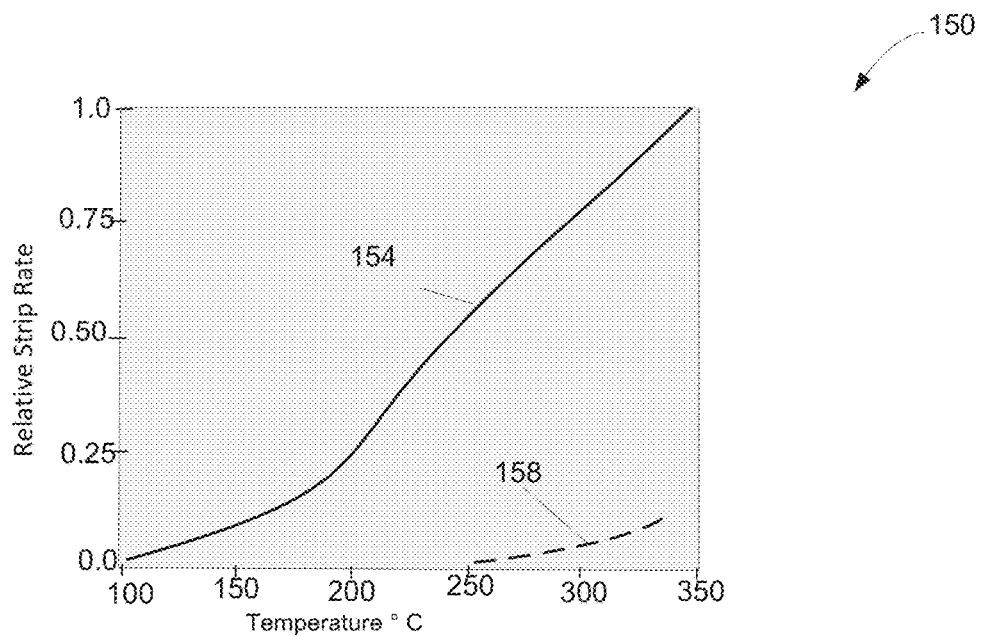
FIG. 1 depicts an exemplary prior art graph of relative strip rate as a function of temperature of the resist versus the carbonized layer. Refer to Butterbaugh Presentation on "ASH-FREE, WET STRIPPING OF HEAVILY IMPLANTED PHOTORESIST", FSI International, Surface Preparation and Cleaning Conference, Austin, Tex., on May 4, 2006.

FIG. 1A depicts an exemplary prior art architectural diagram 100 of the profile of a structure with a crust 108 fused to the surface, points 124, of a structure 104 in the substrate 128 and profile of an adjoining structure 116 without crust fused to the surface, points 120. The high dose ions 112 used in a previous process can cause development of the crust 108 that makes cleaning difficult. Formation of the crust 108 can be at the surface, points 124, of structure 104 in substrate 128 or near the edge bead region (not shown) of the substrate 128. Resist strip performance depends on the ion implant dose and energy. Effectiveness of a resist strip performance is correlated to the extent of removal percentage of the resist, speed of the process, and cost of ownership, which shall be discussed below. FIG. 1B depicts exemplary prior art graphs 150 of relative strip rate as a function of temperature of the resist compared to the temperature of the carbonized layer, such as the crust 108 in FIG. 1A. The relative strip rate graph 154 for the resist has a greater up-slope as the temperature goes from 100° C. to 350° C. ending at 1.00 relative strip rate compared to the relative strip rate graph 158 of the carbonized layer at less than 0.20 relative strip rate at 340° C. Furthermore, the energy used in stripping the resist was much less, $E_a=0.17$ ev, compared to the energy used in stripping the carbonized layer, $E_a=2.60$ ev, with the carbonized layer having a much lower relative strip rate.

Figure 2:
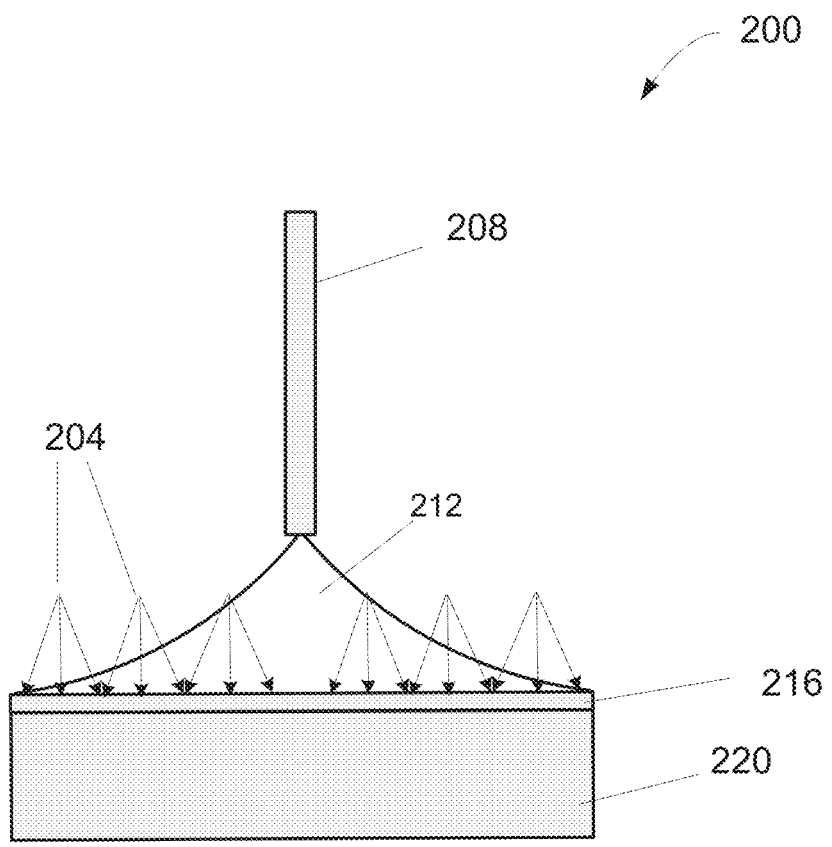
FIG. 2 depicts an exemplary prior art architectural diagram of a single substrate implementation of the first step of a UV peroxide process for stripping an ion implant resist layer.

FIG. 2 depicts an exemplary prior art architectural diagram 200 of a single substrate implementation of the first step of a UV peroxide process for stripping an ion implant resist layer. A dispense nozzle 208 is used to dispense hydrogen peroxide solution 212 onto a rotating substrate 220 where the substrate 220 has an ion implant resist layer 216 and the substrate 220 was immersed in the hydrogen peroxide solution 212. The UV lamp 204 directs the irradiation concurrently on the hydrogen peroxide solution 212. The second step comprises the use of a sulfuric peroxide mixture (SPM) to further remove the rest of the resist layer 216 not removed in the first step. Current art cleaning techniques generally use 254 nm UV lamps, the hydrogen peroxide solution 212 at 1 to 30 wt % at 25 to 60° C., and the SPM with a ratio of 2:1 sulfuric acid to hydrogen peroxide. The highest resist strip performance for current art was obtained with 5 wt % hydrogen peroxide solution in the first step and total of 15 minutes to complete the first and second steps.

Figure 3:
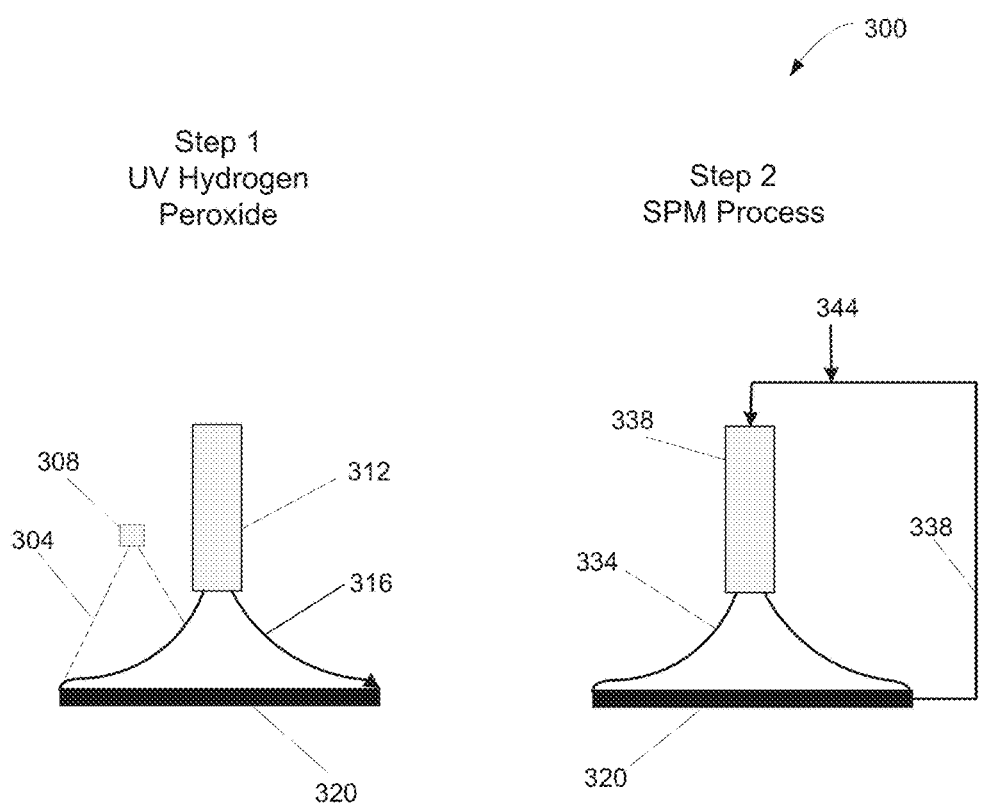
FIG. 3 depicts an exemplary architectural diagram of the two-step UV peroxide (UVP) and sulfuric peroxide mixture (SPM) processes in an exemplary embodiment of the present invention.

FIG. 3 depicts an exemplary architectural diagram 300 of the two-step UV-peroxide (UVP) and sulfuric peroxide mixture (SPM) processes in an exemplary embodiment of the present invention. In Step 1 (first step), a substrate 320 having a resist layer is positioned in a processing chamber (not shown), the substrate rotating at a first rotation speed of 300 to 12,000 rpm, and is immersed in 10 wt % $H_2O_2$ 316, from one or more nozzles 312. The immersed substrate 320 is concurrently irradiated with one or more UV lamps 308 where the UV light 304 generated is 254 nm. In Step 2 (second step), a nozzle 338 is used to dispense SPM 334 having a ratio of about 20:1 of sulfuric acid to hydrogen peroxide where the SPM 334 is dispensed onto the substrate 320 at about 150° C., and the substrate 320 is in a second rotation speed of from 300 to 1,000 rpm. The SPM 334 can optionally be recirculated with a recycle subsystem 338 where new hydrogen peroxide can be introduced to maintain a target ratio of the sulfuric acid to hydrogen peroxide, at point 344.

Figure 4A:
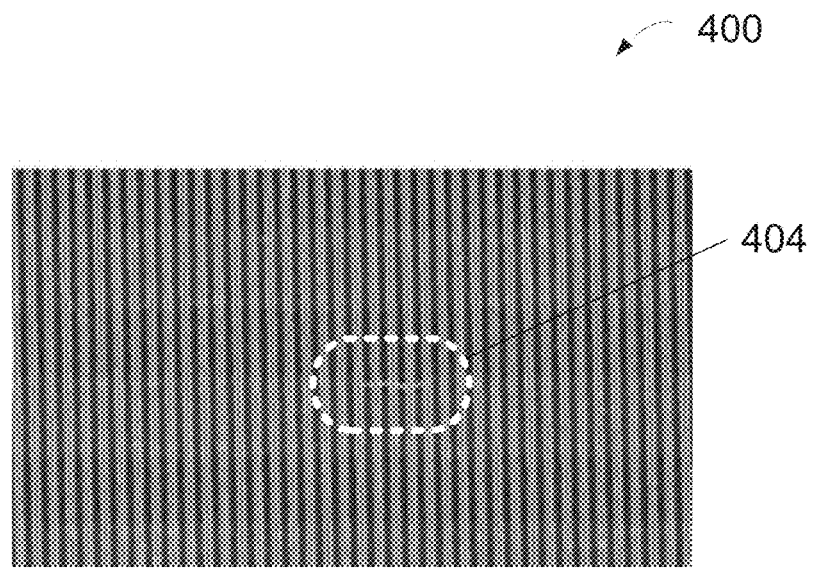
Figure 4B:
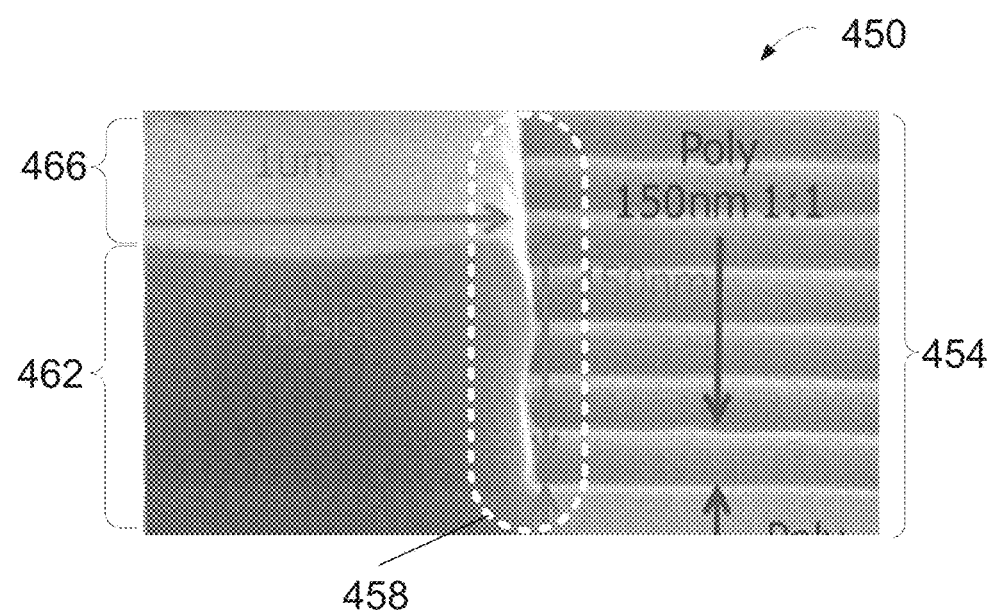
FIG. 4B depicts an exemplary side-view of a portion of substrate prior to cleaning.

FIG. 4A depicts an exemplary top-view 400 of an area of a substrate prior to cleaning while FIG. 4B depicts an exemplary side-view 450 of a portion of substrate prior to cleaning. FIG. 4A shows the residue enclosed in the white dotted line 404 in between the lines and spaces of a grating for cleaning. In FIG. 4B, the side view shows a layer of substrate material 466 above the photoresist 462 and in another portion of the substrate a polymer film 454 is shown. In between the polymer film 454 and the layer of substrate material 466 and the resist 462, residues are also visible in the enclosed area of the white dotted area 458. The object of the cleaning system is to clean the substrate of residue and photoresist 462.

Figure 5A:
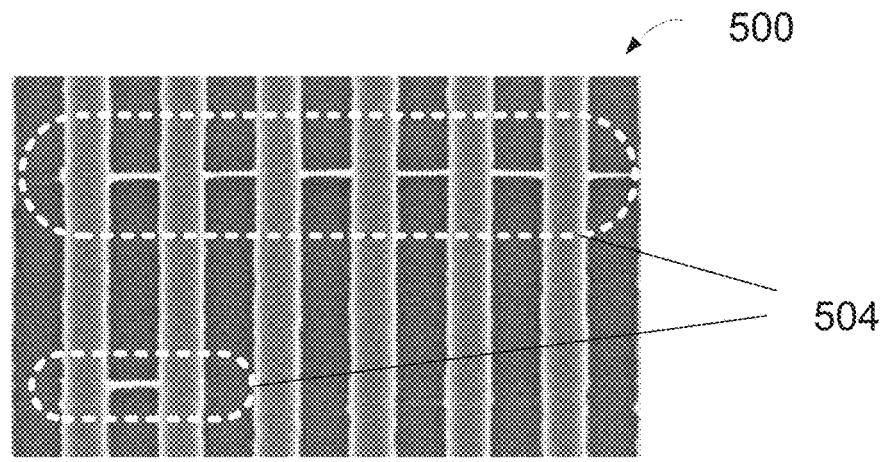
Figure 5B:
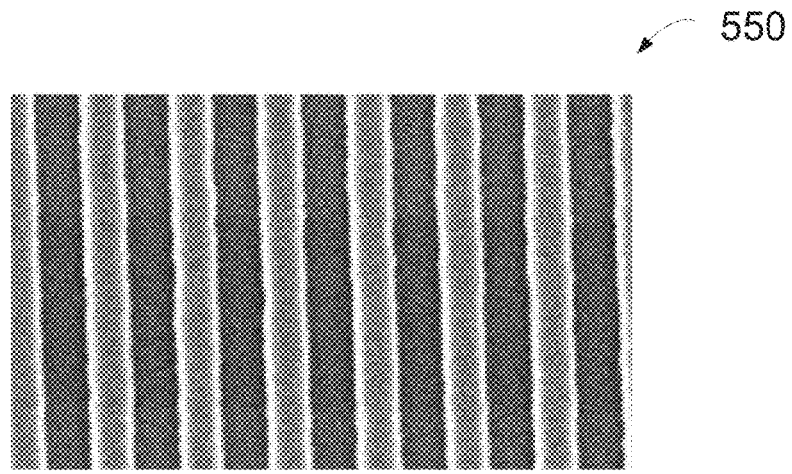
FIG. 5B is another exemplary top-view of the cleaned substrate.

FIG. 5A depicts another exemplary top-view 500 of an area of a substrate before cleaning which shows the residue as a white line in the areas enclosed in the white dotted line while FIG. 5B is another exemplary top view 550 of a cleaned substrate which does not show any presence of residue. As mentioned above, the invention is configured to perform the two-step cleaning operation where the operating variables are concurrently optimized to identify the key operating variables and ranges of the key operating variables for a semiconductor application.

Figure 6A:
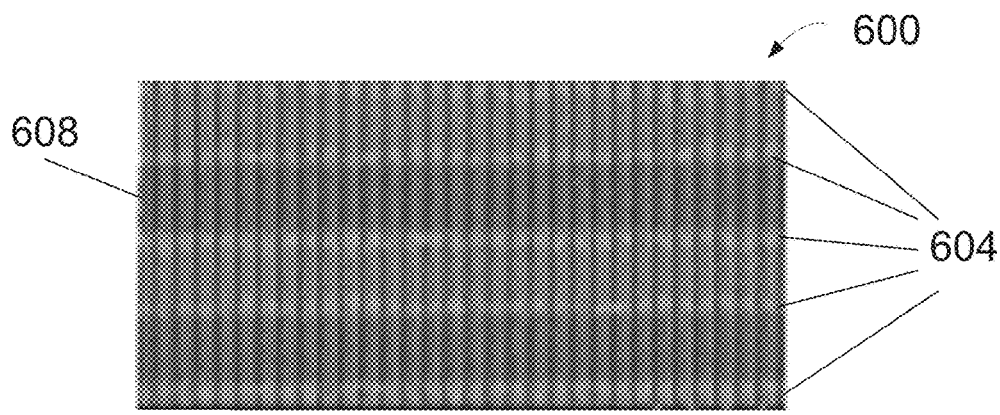
Figure 6B:
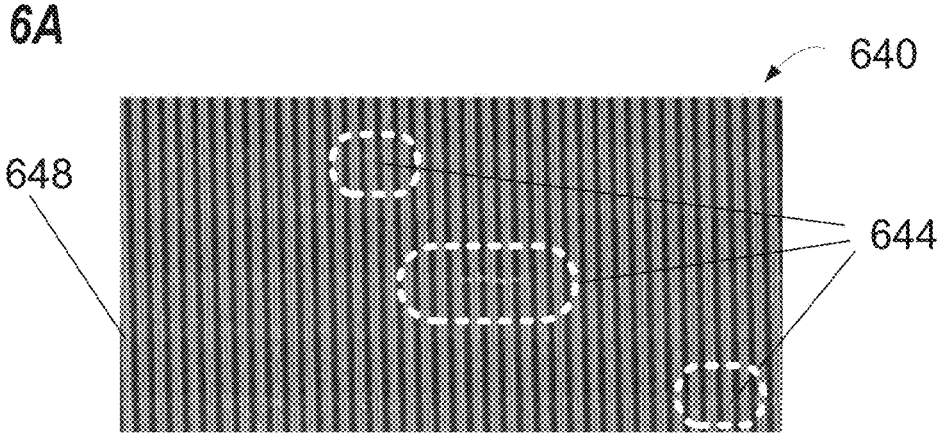
FIG. 6B is an exemplary top-view of a partially cleaned substrate.
Figure 6C:
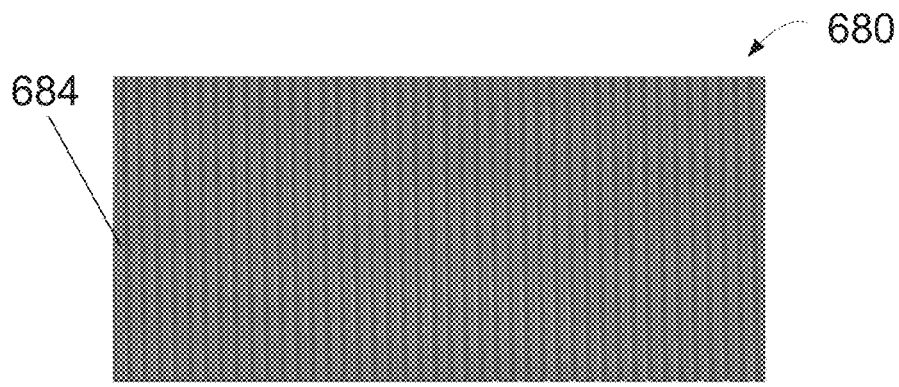
FIG. 6C is another exemplary top-view of a 100% cleaned substrate.

FIG. 6A depicts another exemplary top-view 600 of an area of a substrate before cleaning while FIG. 6B is another exemplary top-view 640 of a partially cleaned substrate; and FIG. 6C is yet another exemplary top-view 680 of a 100% cleaned substrate. In FIG. 6A, the residue can be seen as white, segmented lines 604 in a substrate 608 comprising lines and spaces of a structure on the substrate 608 prior to a cleaning process. FIG. 6B depicts substrate 648 with some leftover residue, such as inside the white dotted ovals, in the substrate after the first step of cleaning with a first chemical and concurrent exposure to UV light. FIG. 6C depicts an exemplary top view 680 of a substrate 684 after both the first step of cleaning with a first chemical and concurrent exposure to UV light and the second step of the cleaning process using a second chemical.

Figure 7:
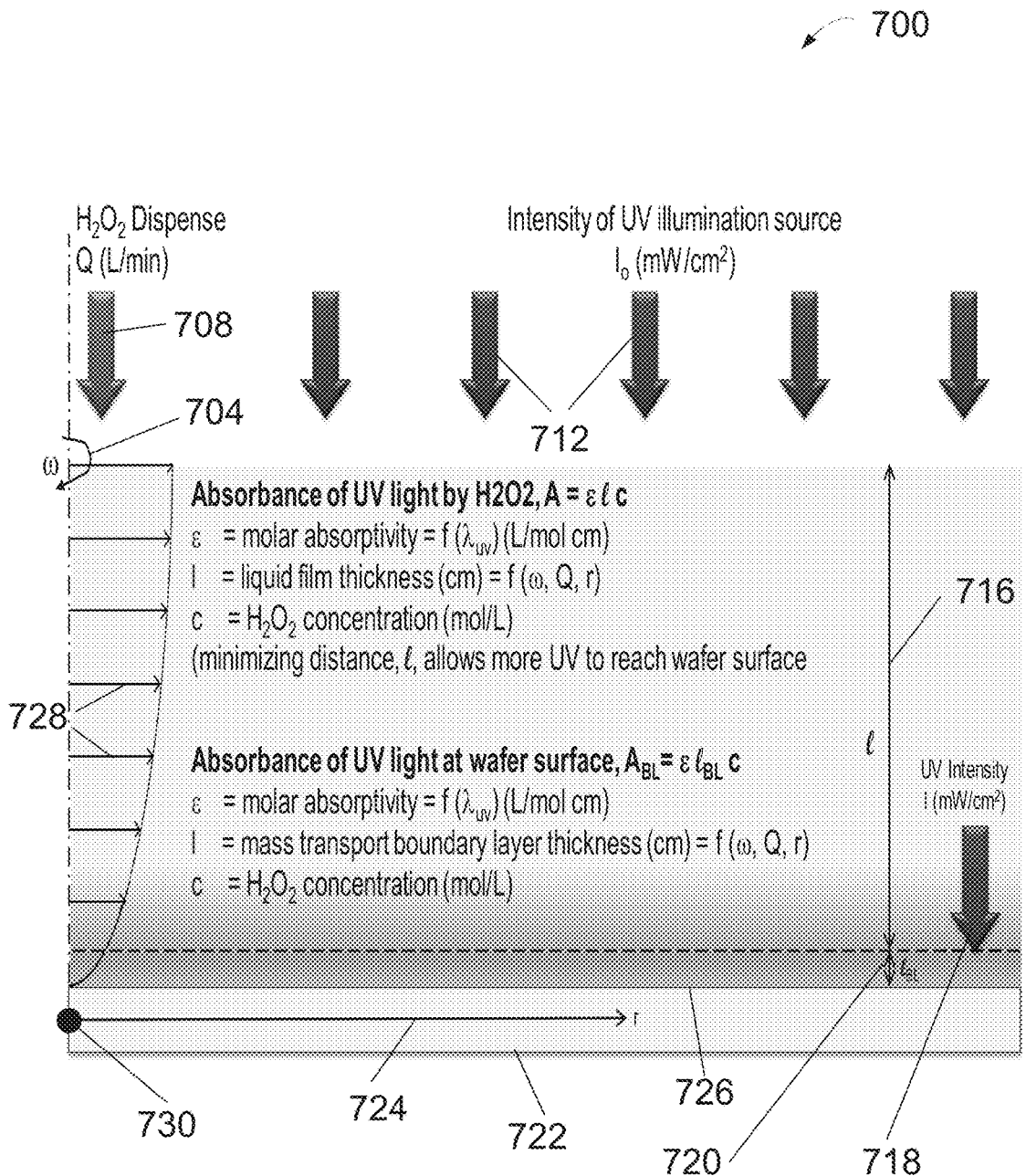
FIG. 7 is an exemplary schematic of the difference in absorbance of UV light as a function of the liquid film thickness of the treatment liquid above the substrate.

FIG. 7 is an exemplary schematic 700 of the difference in absorbance of UV light as a function of the liquid film thickness of the treatment liquid, (H2O2) above the substrate 724. The graph 700 shows a pictorial 708 of the absorbance of UV light by the treatment liquid, hydrogen peroxide (H2O2), at top of and at a lower base (BL) level closer to the bottom of the treatment liquid film near the surface of the substrate 722. The absorbance of UV light by H2O2 is equal to:

$$A = \epsilon l c$$

where $\epsilon$ molar absorptivity=$f(\lambda_{UV})$(L/mol cm),
l=liquid film thickness (cm)=$f(\omega, Q, r)$, and
c=H2O2 concentration (mol/L).

Minimizing, I, 716, allows more UV light to reach the substrate surface 726, The absorbance of UV light at the substrate surface 726 is equal to:

$$A = \epsilon l_{BL} c$$

where $\epsilon$ is molar absorptivity=$f(\lambda_{UV})$(L/mol cm),
l=mass transport boundary layer thickness (cm)=$f(\omega, Q, r)$, and
c=$H_2O_2$ concentration (mol/L).

The peroxide dispense 708 at about the center 730 of the substrate 722 rotating at a rotation speed, $\omega$, expressed in rad/s; Q is the flow rate of the treatment liquid at L/min, $\lambda_{UV}$ is the wavelength of UV source, r is the radial distance where the UV light is hitting the substrate surface 726. As mentioned above, minimizing the liquid film thickness causes a higher intensity of UV energy 712 to reach the substrate surface 726, generating more hydroxyl radicals, thus increasing the cleaning effect of the first step of cleaning to increase cleaning efficacy and to prepare the hardened crust of residues at the substrate surface 726 for the second step of cleaning with a second chemical.

Figure 8:
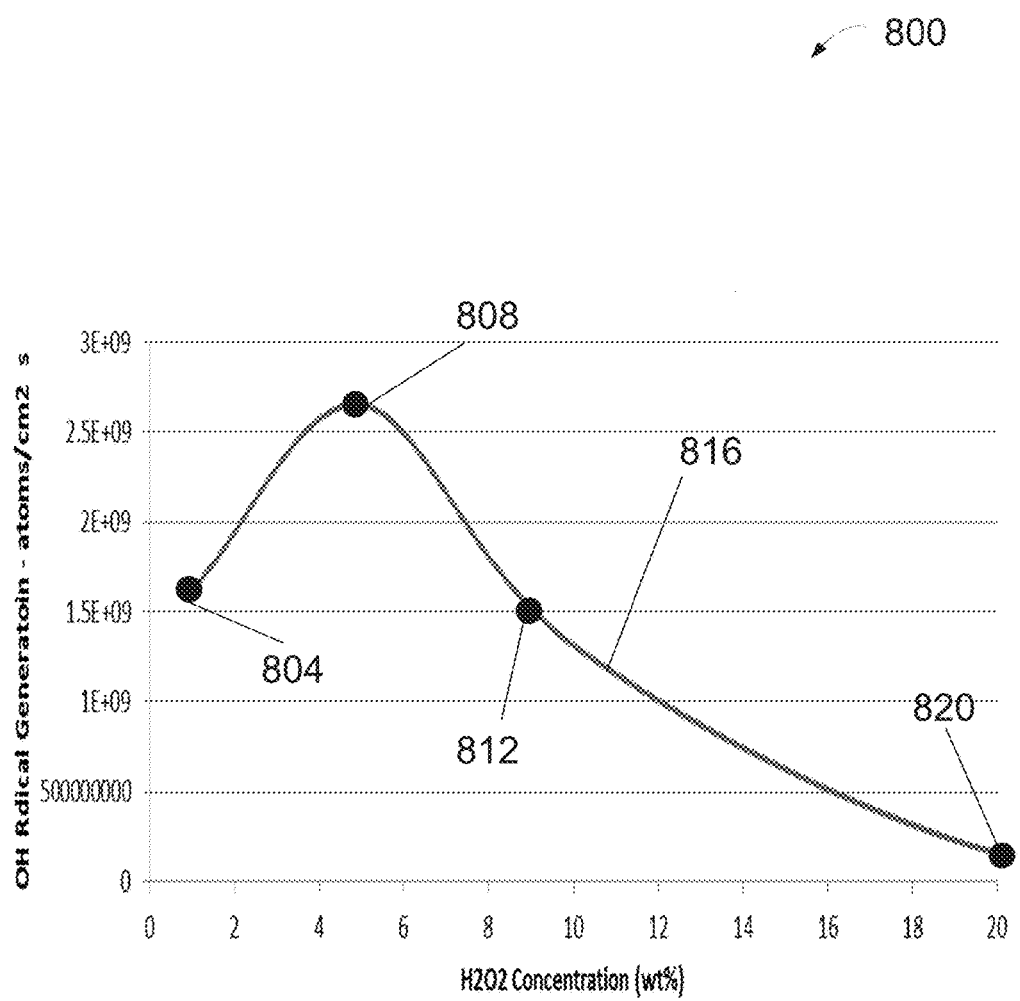
FIG. 8 is an exemplary graph of the hydroxyl radical generation curve as a function of the concentration in weight percent of the hydrogen peroxide.

FIG. 8 is an exemplary graph 800 of the hydroxyl radical generation curve as a function of the concentration in weight percent of the hydrogen peroxide, H2O2. The graph 816 shows that the OH radical generation in atoms/cm² starts at a rate of 1.7 E+09 atoms/cm² at about 1 wt % H2O2, point 804 and rises to a maximum of 2.6+09 atoms/cm², point 808, at about 4.8% goes down to about 1.5 E+09 atoms/cm² at about 9.0 wt %, point 812, and descends dose to a straight line onward toward the end of the scale at 20 wt %, point 820. The desired concentration of hydroxyl radical atoms needs to be optimized in conjunction with the selected two or more cleaning variables for the cleaning process.

Figure 9:
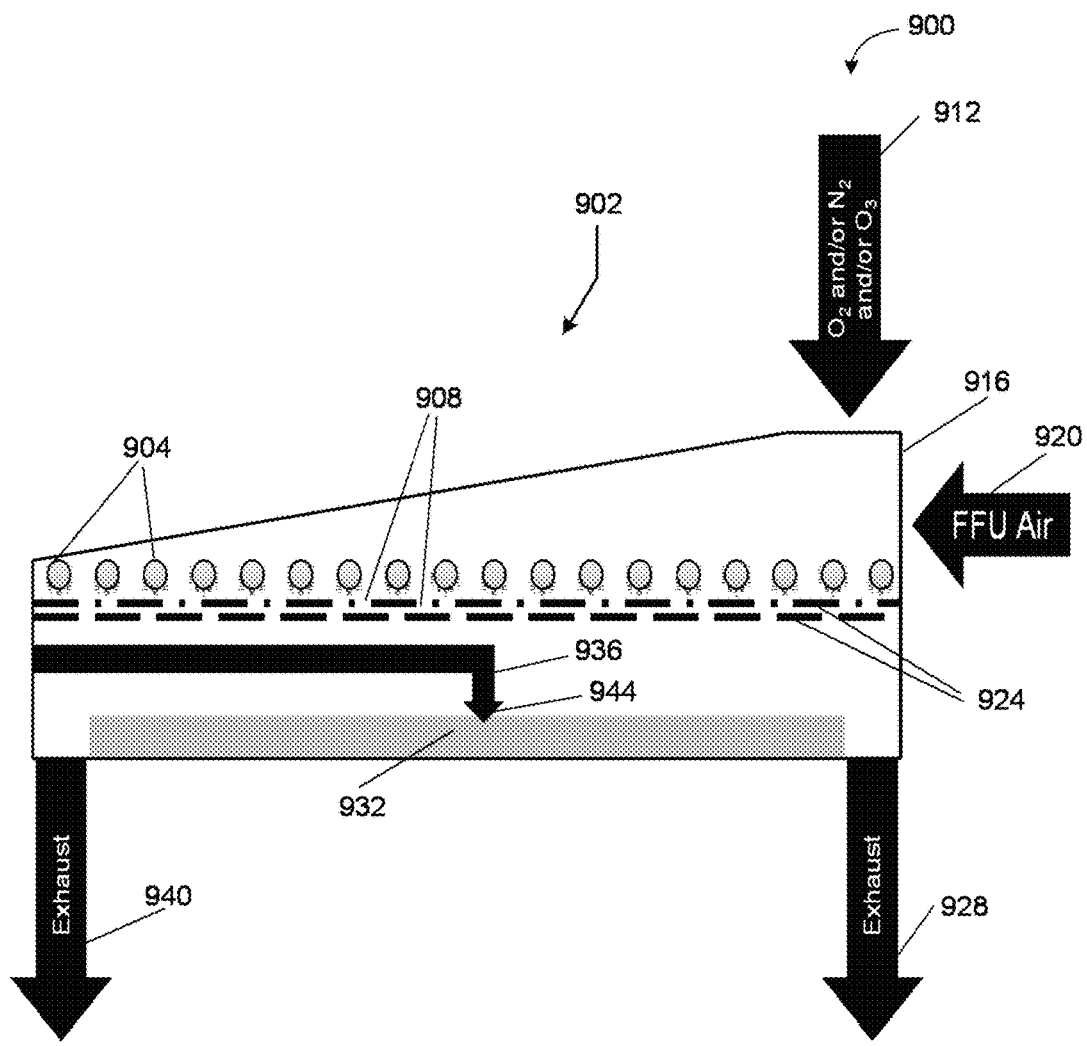
FIG. 9 is an exemplary schematic diagram of a cleaning system in an embodiment of the present invention.

FIG. 9 is an exemplary diagram 900 for a cleaning system 902 where the UV source 904 is located above a diffusion plate 924, the diffusion plate 924 configured to block 185 nm wavelength light to irradiate the substrate 932 during the pre-treatment process and protect the UV source 904 and associated equipment during the subsequent wet clean process. The process gas 912 can comprise oxygen and/or nitrogen. Alternatively, the process gas can comprise oxygen and/or nitrogen and/or ozone. In another embodiment, fan filter unit (FFU) air or CDA 920 can be introduced into the process chamber 916 as the process gas during the pre-treatment process. During the wet clean process, the treatment liquid 944 is delivered into the process chamber 916 by delivery device 936 onto the substrate 932, where the treatment liquid 944 and the process gas 912 or 920 are removed through exhaust units 940, 928. The system hardware for the substrate cleaning system is simplified because there is no requirement for an external oxygen or ozone containing oxygen gas feed into the UV chamber. Processing with standard air has demonstrated the ability to generate sufficient ozone and oxygen atoms for the pre-treatment process to work. Feeding oxygen or ozone carrying gas lines increases tool cost because of the associated hardware design safety requirements. The inventor found out that significantly shorter UV exposure times can be realized by the combined pre-treatment process using UV and a process gas followed by a wet clean process. Further, the inventor was also able to shorten the wet clean process time. Moreover, the generation of in-situ process gas also reduces the number of UV sources employed in the design of the substrate cleaning system. For example, all UV hardware in FIG. 9 is contributing directly to the cleaning of the substrate, ultimately to the generation of atomic oxygen.

Referring to FIG. 9, an embodiment of the invention includes an indirect source of ozone generated either by vacuum UV (VUV) sources (<200 nm), corona discharge or UV source with wavelengths below 200 nm fed into the substrate processing chamber while under irradiation with 254 nm only radiation. The absorption of the radiation by the ozone initiates the formation of oxygen atoms at the substrate surface that enable the damage-free cleaning of substrates. Alternatively, in another embodiment, the substrate is irradiated with ozone emitting UV where an 185 nm absorbing filter is placed between the substrate with geometry that prevents direct and indirect illumination with 185 nm but allows a diffusion path for ozone to reach the substrate surface. Mass transport of the process gas can be enhanced by flowing the oxygen filled atmosphere through the <200 nm wavelength absorbing gas diffusion plate.

Figure 10:
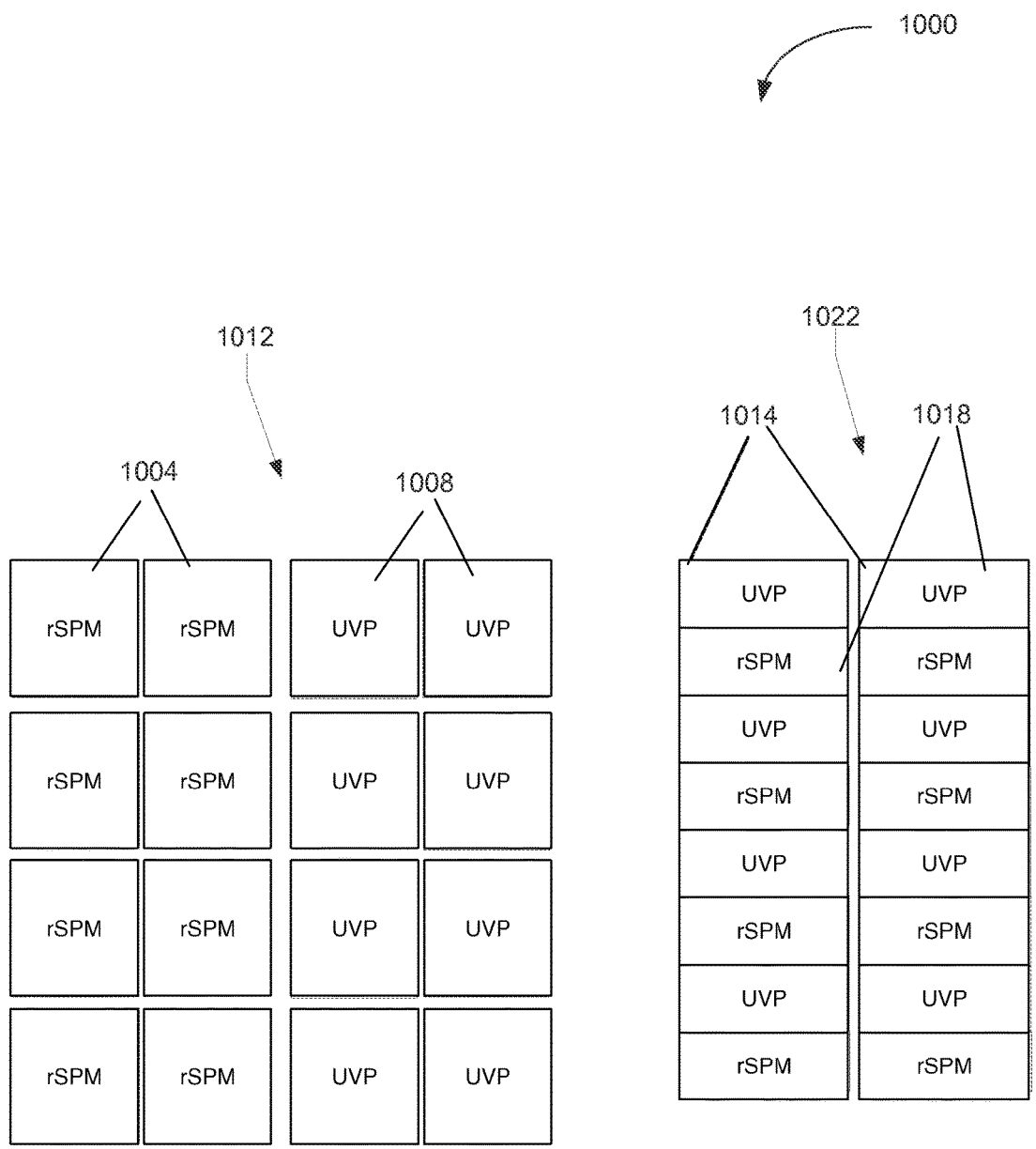
FIG. 10 is an exemplary schematic diagram of stacks of rSPM and stacks of UVP and stacks of UVP and rSPM in one embodiment of the present invention.

FIG. 10 is an exemplary architectural diagram 1000 of a stack of dedicated spin chambers 1012 embodiment and an all-in-one spin chamber 1022 embodiment of the present invention. The dedicated spin chambers 1012 can be one or more stacks of UV-peroxide (UVP) chambers 1008 where the substrate (not shown) is loaded, immersed in the hydrogen peroxide solution and concurrently irradiated with one or more UV light devices for a first process time at a first rotation speed of the substrate. Other oxidizers in addition to hydrogen peroxide can also be used. The substrates (not shown) are unloaded from the UVP chambers 1008 and loaded onto the recycle SPM (rSPM) processing chamber 1004 where the resist is treated with SPM for a second process time at a second rotation speed of the substrate. In another embodiment, the all-in-one spin chambers 1022 can be one or more stacks of processing chambers each further comprising a UVP chamber 1014 and an rSPM chamber 1018. In an embodiment, the UVP chamber 1014 and the rSPM chamber 1018 can be a single processing chamber having one of more nozzles for dispensing the hydrogen peroxide solution and/or the SPM. Alternatively, different nozzles can be used for dispensing the hydrogen peroxide solution and the SPM. In other embodiments, acids other than sulfuric acid and oxidizers other than hydrogen peroxide can also be used.

Figure 11:
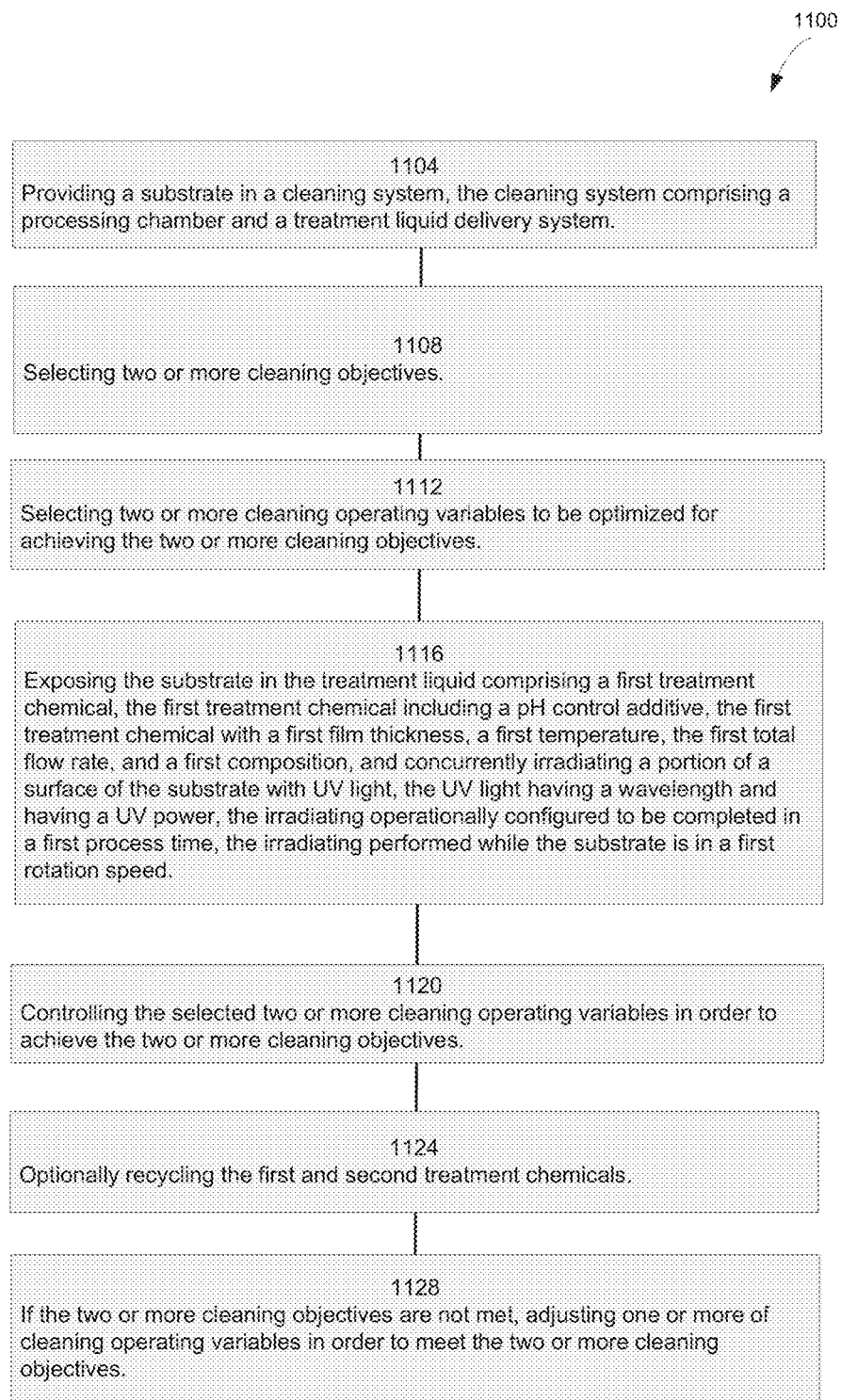
FIG. 11 is an exemplary method flowchart of an embodiment of the present Invention.

FIG. 11 is an exemplary method flowchart 1100 of an embodiment of the present invention. In operation 1104, a substrate is provided in a cleaning system comprising a processing chamber and a treatment liquid delivery system. The substrate cleaning may be a post-etch stripping of an ion implanted resist or cleaning or performing a post-etch cleaning. Moreover, the substrate cleaning process include means for performing a standard clean 1 (SC 1), a standard clean 2 (SC 2), water cleaning, or solvent cleaning and/or wherein the substrate cleaning process performed includes a treatment liquid comprising hydrofluoric acid (HF), diluted HF, or buffered HF; or the substrate cleaning process includes a treatment liquid comprising deionized water, isopropyl alcohol, deionized water and ozone, rinsing fluids, sulfuric acid peroxide mixture (SPM), sulfuric acid peroxide and ozone mixture (SOM), phosphoric acid, or phosphoric acid and steam mixture. In an embodiment, treatment liquid is a sulfuric acid peroxide mixture (SPM) or sulfuric acid peroxide and ozone mixture (SOM), the substrate cleaning process is photoresist stripping. All the above cleaning process chemistries are known to people in the art.

The flow rate of the SPM can be 2 liters per minute or less, the selected two or more dispense devices can comprise 5 nozzles, including a central nozzle and 4 additional nozzles, arranged in a line pattern, and the substrate can be from 200 to 450 mm. The selected two or more dispense devices can have varying sizes of dispense width. In one embodiment, the selected two or more dispense devices are positioned above the substrate according to a selected pattern, the selected pattern including a height from the substrate surface to the dispense device and distance between a central dispense device and each additional dispense device of the selected two or more dispense devices. In another embodiment, the selected two or more dispense devices can comprise a central nozzle and one or more additional nozzles located at selected distances from the central nozzle towards an edge of the substrate, the central nozzle configured with a flow rate lower than any of the one or more additional nozzles. The dispense width of a nozzle requires sufficient size to allow a continuous dispense of the treatment liquid at the selected flow rate of the dispense device when continuous flow is desired. In yet another embodiment, spray nozzles can also be used. Nitrogen or air can be mixed with the treatment liquid to use in a spray nozzle to spread out and thin the peroxide film across the substrate to increase generation of hydroxyl radicals.

For example, the first delivery device nozzles can be configured to support a treatment liquid flow rate in a range from 15 to 500 mL/min, 15 mL/min, or less than 15 mL/min. In still another embodiment, selection and placement, the selected two or more dispense devices comprising of nozzles can be connected to a single supply line and the duty cycle requires sequential turning on and turning off from a central nozzle towards a nozzle closest to the edge of the substrate and from the nozzle closest to the edge of the substrate towards the central nozzle. In yet another embodiment, each dispense device of the selected two or more dispense devices can be independently connected to a supply line and can be turned on and turned off independently; and/or wherein the selected two or more dispense devices are disposed in a line pattern, a cross pattern, a 3-ray star pattern configuration; and/or wherein the selected two or more dispense devices can be turned on and turned off independently.

In operation 1108, two or more cleaning objectives are selected. The two or more cleaning objectives can comprise least two of: (1) target first process time, (2) target first rotation speed, (3) a target total process time, (4) target liquid film thickness of the first chemical, for example, the hydrogen peroxide in an SPM combination, and the like. The thinner film of the first chemical can provide improved performance because more UV is absorbed by the first chemical. In an UV-peroxide embodiment, two hydroxyl radicals are generated when UV is absorbed. The hydroxyl radicals react with the ion implanted crust and enable easier removal in the subsequent SPM step. In an embodiment, the cleaning objectives can be the target first rotation speed of 2000 rpm or less, 20 wt % hydrogen peroxide, and target first process time of 3 minutes or less.

In operation 1112, two or more cleaning operating variables to be optimized for achieving the two or more cleaning objectives are selected. In operation 1116, a surface of the substrate is exposed to the treatment liquid comprising a first treatment chemical, the first treatment chemical with a first film thickness, a first temperature, the first total flow rate, and a first composition, and concurrently irradiating a portion of a surface of the substrate with UV light, the UV light having a wavelength and having a UV power, the irradiating operationally configured to be completed in a first process time, the irradiating performed while the substrate is in a first rotation speed. Corresponding cleaning operating variables for the second step involving the second process chemical can also be selected. For example in one embodiment, the second process chemical can be SPM at 170° C., the second process time at 60 seconds or less, and a mixing ratio of 20 parts sulfuric acid to 1 part 25° C. hydrogen peroxide. In one embodiment, additives can be used to control the pH of the first chemical, for example, hydrogen peroxide, to extend or reduce the lifetime of the generated hydroxyl radical. For low pH, hydrochloric acid can be used but other acids such as hydrofluoric acid (HF) or nitric acid $HNO_3$ could be used. For high pH, tetramethyl ammonium hydroxide (TMAH) or ammonium hydroxide ($NH_4OH$) can be used to increase the pH to 10 or higher.

In operation 1120, the substrate is exposed to a second treatment liquid, the second treatment chemical having a second temperature, a second flow rate, a second composition, a second process time, and a second rotation speed. In operation 1124, the selected plurality of cleaning operating variables are controlled in order to achieve the two or more cleaning objectives. In operation 1128, the first and second treatment chemicals are optionally recycled so as to reduce treatment liquid usage. In operation 1132, if the two or more cleaning objectives are not met, one or more of cleaning operating variables are adjusted in order to meet the two or more cleaning objectives.

Figure 12:
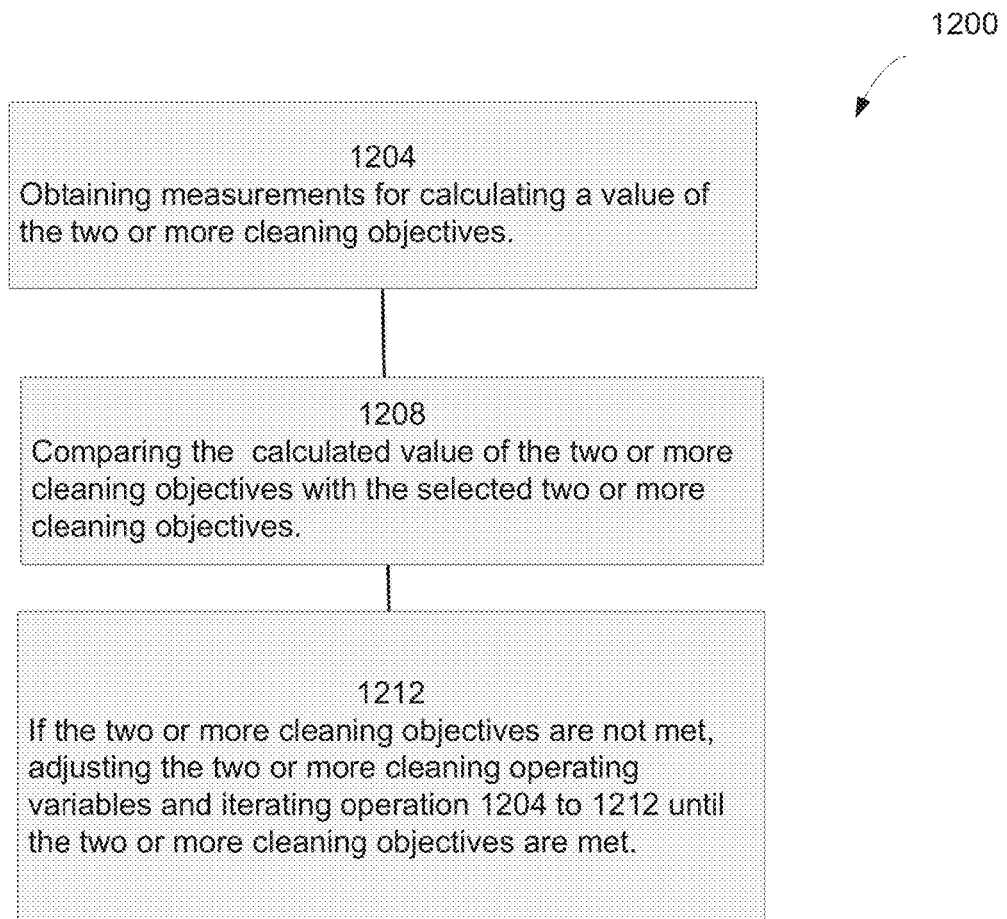
FIG. 12 is an exemplary architectural diagram of a single substrate cleaning system in an embodiment of the invention utilizing optical and process metrology tools.

FIG. 12 is an exemplary flowchart 1200 of adjusting one or more treatment operating variables to meet the two or more objectives of the present invention. In operation 1204, measurements are obtained for calculating a value of the two or more cleaning objectives. As will be discussed below, optical metrology devices, such as reflectometer or interferometer used to obtain a film thickness of the treatment liquid above a surface of the substrate and/or process metrology devices are used to obtain other measurements. In operation 1208, the calculated value is obtained of the two or more cleaning objectives with the selected two or more cleaning objectives. In operation 1212, if the two or more cleaning objectives are not met, the two or more cleaning operating variables are adjusted and operations 1204 to 1212 are iterated until the two or more cleaning objectives are met. The inventors found that increasing the speed of rotation of the substrate up to over 6,000 rpm significantly improved the cleaning performance with the subsequent wet cleaning step in an SPM application. As the rotation speed increases and the size of the substrates were increased, some operating issues materialized. As the rotation was reduced, the film thickness of the treatment liquid was kept low by using spray nozzles and/or use of pH additives. Cycling the on and off cycle and placement of the nozzles also provided improvements and can produce unwanted particles in the flow. Adjustment of the flow rates of the central and additional nozzles also provided incremental changes. The inventors concluded that concurrent optimization of selected cleaning operating variables is needed to identify the key operating variables and ranges of these key operating variables needed to be determined in order to develop a process sequence that is configured to achieve the two or more cleaning objectives selected for a semiconductor application.

Figure 13:
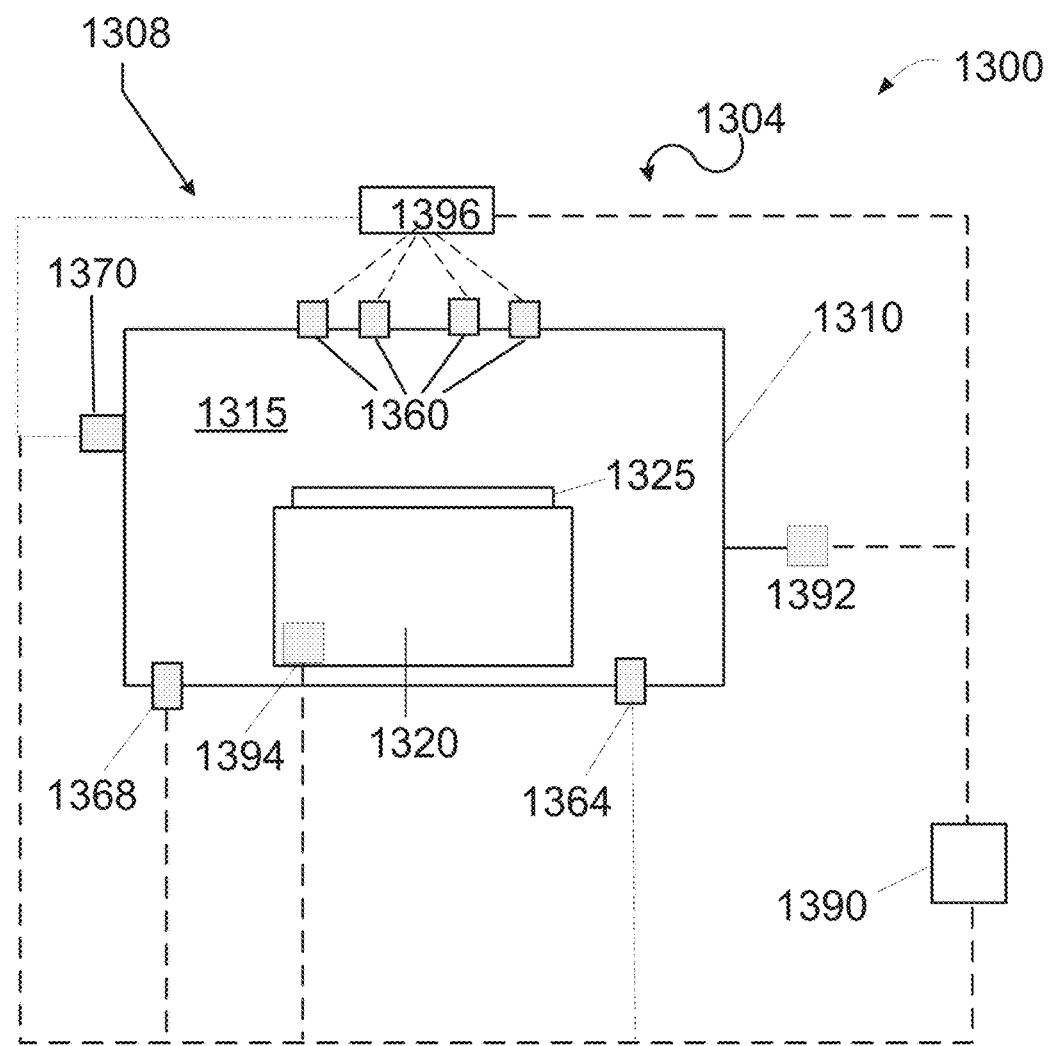
FIG. 13 is an exemplary architectural diagram of a single substrate resist treatment system in an embodiment of the invention utilizing optical tools and process metrology tools.

FIG. 13 is an exemplary architectural diagram 1300 of a cleaning system 1304 depicting use of a controller 1390 for optimizing the operating variables of the cleaning system 1304 towards meeting the one or more pre-treatment objectives. The controller 1390 includes storage and memory configured to store and access recipes for cleaning processes including photoresist stripping, post etch cleaning, film etching involving oxide, nitride or metal, particle removal, metal removal, organic material removal, or photoresist developing. In addition, the controller includes storage to store and access the two or more cleaning objectives, wherein the two or more cleaning objectives further include a process completion percentage and cost per unit throughput or a process completion percentage and cost of ownership per unit of throughput or a total cleaning time.

The controller 1390 can include computer capabilities a) to obtain metrology measurements and/or process measurements used to calculate a value for the selected one or more cleaning objectives, b) if the one or more cleaning objectives are not met, to adjust the process operating variables including adjusting the flow rate of the selected two or more dispense devices, rotation speed of the substrate, duty cycle of each of the selected two or more dispense devices until the one or more cleaning objectives are met. Moreover, the controller 1390 also contains logic circuitry or computer code to concurrently optimize a selected flow rate, dispense flow type, position of a dispense device, height of dispense, and duty cycle for turning on or turning off each of the selected two or more dispense devices, pattern used in positioning the selected two or more dispense devices, and rotation speed of the substrate. Operating data obtained from optimization tests are incorporated into procedures and recipes for combinations of substrate cleaning processes and cleaning operating variables are loaded into the controller 1390. The cleaning system is configured to run in either online mode with metrology feedback or offline mode that does not require continuous metrology feedback, instead using the procedures and recipes.

The cleaning system 1304 can use two or more optical metrology devices 1308. An optical emission spectroscopy (OES) device 1370 can be coupled to the processing chamber 1310 at a position to measure the optical emission from the processing region 1315. In addition, another set of optical metrology devices 1360 can be disposed atop the processing chamber 1310. Although four optical metrology devices are shown, many other alternative and different configurations of the optical metrology devices can be positioned to implement design objectives using a plurality of optical metrology devices. The four optical metrology devices can be spectroscopic reflectometric devices and/or interferometric devices. The measurements from the two or more optical metrology devices, for example, the OES device 1370 and the set of optical metrology devices 1360, are transmitted to the metrology processor (not shown) where one or more critical dimension values are extracted. Measurements can be performed with the one or more optical metrology device OES 1370 and/or the set of optical metrology devices 1360 and one or more etch sensor devices, 1364 and 1368.

As mentioned above, a process sensor device, for example, can be a residue sensor device 1364 measuring the percentage of residue remaining, or measuring a cleaning operating variable with a substantial correlation to percentage of residue removal, Another process sensor device can include a device measuring the partial pressure of oxygen or the oxygen and ozone partial pressures or the total pressure of the process gas. Selection of at least one or more process sensor devices can be done using multivariate analysis using sets of process data, metrology data (diffraction signals) and process performance data to identify these inter-relationships. The measurements from the two or more optical metrology devices, for example, the OES device 1370 and the set of optical metrology devices 1360 and the measurement from the sensor device 1364 and/or 1368 are transmitted to the metrology processor (not shown) where the operating variable values are extracted, Another process sensor device is a temperature measurement device that is used to the temperature of the treatment liquid along the radial line in order to determine the temperature gradient of the treatment liquid from the center to an edge of the substrate. The controller can compare the measured temperature gradient to the set temperature gradient for the application and adjust one or more of the cleaning operating variables to get the temperature to the accepts be range.

Still referring to FIG. 13, the cleaning system 1304 includes a controller 1390 coupled to sub-controllers in the two or more optical metrology measurement devices 1309 comprising a plurality of optical metrology devices 1360, optical emission spectroscopy (OES) device 1370, and one or more etch sensor devices, 1364 and 1368. One or more chemical monitors 1392 can be coupled to the processing chamber to ensure the process gas is within the ranges set, Another sub-controller 1394 can be included in the motion control system 1320 that is coupled to the controller 1390 and can adjust the first and second speed of the rotation of the motion control system for a singe substrate tool. The motion control system 1320 is configured to handle substrates from 150 to 450 mm or greater than 150 mm. The controller 1390 can be connected to an intranet or via the Internet to other controllers in order to optimize the cleaning operating variables and in order to achieve the one or more pre-treatment objectives.

Although only certain embodiments of this invention have been described in detail above, those skilled in the art will readily appreciate that many modifications are possible in the embodiments without materially departing from the novel teachings and advantages of this invention. For example, although one exemplary process flow is provided for cleaning of substrates, other process flows are contemplated. As also mentioned above, the cleaning method and system of the present invention can be used in an FEOL or BEOL fabrication cluster. Accordingly, all such modifications are intended to be included within the scope of this invention.

What is claimed:

1. A method for cleaning a layer on a substrate using a cleaning system, the cleaning system comprising a processing chamber and a treatment delivery system, the treatment delivery system comprising a first delivery device and a second delivery device, the method comprising:
   providing a substrate in the cleaning system, the substrate having an ion implanted resist layer or a substrate after an ashing process;
   selecting two or more cleaning objectives and a plurality of cleaning operating variables to be optimized for achieving the two or more cleaning objectives;
   selecting an arrangement of two or more nozzles of the first delivery device and creating a duty cycle for turning on and turning off flow of a treatment liquid through the two or more nozzles, the sum of the flow of the treatment liquid through the two or more nozzles being a first total flow rate;
   exposing the substrate in the treatment liquid comprising a first treatment chemical, the first treatment chemical including a pH control additive, the first treatment chemical with a first film thickness, a first temperature, the first total flow rate, and a first composition, the exposing performed with the first delivery device and concurrently irradiating a portion of a surface of the substrate with ultra-violet (UV) light, the UV light having a wavelength and having a UV power, the irradiating operationally configured to be completed in a first process time, the irradiating performed while the substrate is in a first rotation speed;
   obtaining continuous metrology feedback for calculating the two or more cleaning objectives, generating two or more calculated cleaning values;
   comparing the two or more calculated cleaning values to the two or more cleaning objectives; and
   if the two or more cleaning objectives are not met, adjusting the selected two or more cleaning operating variables or selecting a different two or more cleaning operating variables and iterating the obtaining continuous metrology feedback, comparing the two or more calculated cleaning values to the two or more cleaning objectives, and adjusting the two or more selected cleaning operating variables until the two or more cleaning objectives are met,
   wherein the plurality of cleaning operating variables comprise two or more of the first temperature, the first composition, first film thickness, the UV wavelength, the UV power, the first process time, the first rotation speed, the pH of the treatment liquid; the duty cycle of the first delivery device, and percentage of residue removal.

2. The method of claim 1, wherein the first treatment chemical is a hydrogen peroxide solution, the two or more cleaning objectives are selected from the first film thickness, the first process time, and the percentage of residue removal, and wherein the selected two or more cleaning operating variables are selected from the first rotation speed, the pH of the treatment liquid; and the duty cycle of the first delivery device.

3. The method of claim 1, wherein exposing the substrate in the treatment liquid comprising the first treatment chemical utilizes a spray nozzle configured to spread out and thin the first treatment chemical across the substrate.

4. The method of claim 3, wherein the spray nozzle utilizes a nitrogen or air jet to generate the spray in the spray nozzle.

5. The method of claim 1, further comprising:
   dispensing onto the substrate a second treatment chemical using the second delivery device, the second treatment chemical at a second temperature, a second flow rate, and a second composition, the second treatment chemical dispensed onto a portion of a surface of the substrate at a dispense temperature, the dispensing operationally configured to be completed in a second process time and the dispensing performed while the substrate is in a second rotation speed.

6. The method of claim 5, wherein the pH control additive is hydrochloric acid, hydrofluoric acid, or nitric acid when an acidic pH is required and tetramethyl ammonium hydroxide (TMAH) or ammonium hydroxide when a basic pH is required.

7. The method of claim 5, wherein the layer to be cleaned is an ion implanted resist that formed a residue during an ion implantation process or wherein the substrate to be cleaned is a substrate after an ashing process, and wherein the two or more cleaning objectives comprise a percentage of residue removal and a total process time, the total process time being the sum of the first process time and the second process time; and
   wherein the cleaning operating variables further include the second temperature, the second composition, the second process time, the second rotation speed, and the dispense temperature.

8. The method of claim 7,
   wherein the first treatment chemical is a hydrogen peroxide solution and the second treatment chemical is a sulfuric acid peroxide mixture (SPM); or
   wherein the first treatment chemical is hydrogen peroxide and the second treatment chemical is a sulfuric acid and ozone mixture (SOM); or wherein the first chemical is water, hydrogen peroxide aqueous solution, or hydrogen peroxide semi-aqueous solution with organic co-solvents, ammonia aqueous, or ammonia semi-aqueous solution; and
   wherein the organic co-solvents include isopropyl alcohol (IPA), n-methylpyrrolidone (NMP), dimethyl sulfoxide (DMSO), or acetone; wherein the peroxide or hydroperoxide aqueous or semi-aqueous solutions includes a structure R—O—H—R' wherein R is any organic or inorganic species including benzoyl peroxide, tert-butyl hydroperoxide (TBHP), methyl ethyl ketone peroxide, or acetone peroxide.

9. The method of claim 8, wherein the percentage of residue removal is 95.0 percent or higher and the UV light is in a range of 172 to 300 nm, and the UV power is 20 mJ/cm$^2$ or higher.

10. The method of claim 8,
    wherein the first temperature is in a range of 25 to 100 degrees C. and the second treatment chemical is in a range of 140 to 200 degrees C.; and/or
    wherein the second treatment chemical is dispensed onto the substrate at 150 degrees C. or lower.

11. The method of claim 8, wherein the SPM comprises a mixture of 10:1 to 30:1 sulfuric acid solution to hydrogen peroxide.

12. The method of claim 8,
wherein the two or more cleaning operating variables comprise the first rotation speed and first flow rate; or
wherein the two or more cleaning objectives comprise the percentage of residue removal and total process time.

13. The method of claim 8, wherein the two or more cleaning objectives comprise cost of ownership per unit throughput and total process time.

14. The method of claim 8,
wherein the cleaning system comprises a stack of two or more ultra-violet peroxide (UVP) units and a stack of two or more recycle sulfuric acid peroxide mixture (rSPM) units or a stack of two or more of all-in-one spin chambers each further comprising a combined ultra-violet peroxide (UVP) and recycle sulfuric acid peroxide mixture (rSPM) units; and/or
wherein the first delivery device is the same as the second delivery device.

15. The method of claim 8, further comprising recycling the first treatment chemical and/or the second treatment chemical;
wherein the two or more nozzles are spray nozzles.

16. The method of claim 8, further comprising:
injecting a jet of nitrogen or air to spread out and make the first treatment chemical thinner across the substrate surface.

17. The method of claim 16, wherein the first temperature, first film thickness, the UV wavelength, the UV power, the first process time, the first rotation speed, the pH of the treatment liquid, the second process time, and the duty cycle of the first delivery device are concurrently optimized to meet the cleaning objectives of 100% residue removal at the first rotation speed of 2,000 rpm or less, the first process time of 180 seconds or less, and the second process time of 60 seconds or less.

18. The method of claim 8,
wherein the total process time is 240 seconds or less; or
wherein the first process time is in a range of 40 to 80 seconds and the second process time is in a range of 40 to 80 seconds; and/or
wherein the first rotation speed is in a range of 300 to 12,000 rpm; and/or
wherein the hydrogen peroxide solution is in a range of 10 wt % to 35 wt %.

19. The method of claim 18,
wherein setting a nozzle of the two or more nozzles as a central nozzle at below 75 mL/min flow of treatment liquid and positioning one or more additional nozzles of the two or more nozzles at between 5 to 145 mm from the central nozzle until complete wetting of the substrate is achieved; and
wherein the first total flow rate is in a range from 250 to 2,500 mL/min or wherein the two or more nozzles is in a range from 2 to 20 nozzles.

20. The method of claim 19, wherein the duty cycle flow on is from 1.5 to 5 seconds and the flow off is from 1.5 to 2.5 seconds.

\* \* \* \* \*

UNITED STATES PATENT AND TRADEMARK OFFICE
CERTIFICATE OF CORRECTION

| | |
|---|---|
| PATENT NO. | : 9,735,026 B2 |
| APPLICATION NO. | : 14/091923 |
| DATED | : August 15, 2017 |
| INVENTOR(S) | : Ian J. Brown et al. |

It is certified that error appears in the above-identified patent and that said Letters Patent is hereby corrected as shown below:

On the Title Page

In Column 2, Lines 11-12, "The cleaning operating variables comprise two or more" should read --The cleaning operating variables comprising two or more--.

In the Specification

In Column 1, Line 30, "material, Radicals are" should read --material. Radicals are--.

In Column 2, Line 5, "Ra haven, et al.," should read --Raghaven, et al.,--.

In Column 2, Line 42, "single substrate process to competitive" should read --single substrate process competitive--.

In Column 2, Line 46, "operating variables need to identified" should read --operating variables need to be identified--.

In Column 2, Line 49, "and achieve the two or more" should read --and achieves the two or more--.

In Column 5, Line 40, "where ε molar absorptivity" should read --where ε is molar absorptivity--.

In Column 5, Line 44, "substrate surface 726, The" should read --substrate surface 726. The--.

In Column 5, Line 53, "substrate 722 rotating" should read --substrate 722 is rotating--.

In Column 6, Line 4, "and descends dose to" should read --and descends close to--.

In Column 7, Line 10, "having one of more" should read --having one or more--.

Signed and Sealed this
Eighth Day of May, 2018

Andrei Iancu
*Director of the United States Patent and Trademark Office*

In Column 8, Lines 13-14, "can comprise least two of:" should read --can comprise at least two of:--.

In Column 9, Line 16, "size of the substrates were increased," should read --size of the substrates was increased,--.

In Column 10, Line 26, "age of residue removal, Another" should read --age of residue remove. Another--.

In Column 10, Line 38, "variable values are extracted, Another" should read --variable values are extracted. Another--.

In Column 10, Line 40, "used to the temperature" should read --used to measure the temperature--.

In Column 10, Line 46, "temperature to the accepts be range." should read --temperature to the acceptable range.--.

In Column 10, Lines 54-55, "the ranges set, Another" should read --the ranges set. Another--.

In the Claims

In Column 12, Lines 50-51, Claim 8, "isopropyl alcohol (WA)," should read --isopropyl alcohol (IPA),--.

In Column 12, Lines 52-53, Claim 8, "wherein the peroxide or hydrop-eroxide aqueous" should read --wherein the peroxide or hydro-peroxide aqueous--.